United States Patent [19]

Enloe et al.

[11] Patent Number: 4,920,640
[45] Date of Patent: May 1, 1990

[54] HOT PRESSING DENSE CERAMIC SHEETS FOR ELECTRONIC SUBSTRATES AND FOR MULTILAYER ELECTRONIC SUBSTRATES

[75] Inventors: Jack H. Enloe, Columbia; John W. Lau, Gaithersburg; Christian B. Lundsager, Ashton, all of Md.; Roy W. Rice, Alexandria, Va.

[73] Assignee: W. R. Grace & Co.-Conn., New York, N.Y.

[21] Appl. No.: 148,829

[22] Filed: Jan. 27, 1988

[51] Int. Cl.$^5$ .......................... H05K 1/03; H05K 1/11; H05K 3/46
[52] U.S. Cl. ....................................... 29/852; 29/846; 29/848; 29/849
[58] Field of Search ................... 29/829, 830, 846–849, 29/851, 852; 524/404; 174/68.5; 361/412, 414

[56] References Cited

U.S. PATENT DOCUMENTS

| | | | |
|---|---|---|---|
| 3,189,978 | 6/1965 | Stetson | 29/155.5 |
| 3,755,204 | 8/1973 | Sergeys | 252/455 R |
| 4,518,736 | 5/1985 | Jahn | 524/404 |

FOREIGN PATENT DOCUMENTS

| | | |
|---|---|---|
| 49-099703 | 9/1974 | Japan . |
| 57-024526 | 7/1980 | Japan . |
| 57-100791 | 6/1982 | Japan . |
| 59-088816 | 5/1984 | Japan . |
| 61-10074 | 6/1984 | Japan . |
| 60-118676 | 6/1985 | Japan . |
| 62-100479 | 10/1985 | Japan . |
| 61-091069 | 5/1986 | Japan . |
| 61-168564 | 7/1986 | Japan . |
| 61-186257 | 8/1986 | Japan . |
| 682477 | 9/1979 | U.S.S.R. . |

Primary Examiner—Mark Rosenbaum
Assistant Examiner—Taylor J. Ross
Attorney, Agent, or Firm—Edward J. Cabic

[57] ABSTRACT

Dense ceramic sheets suitable for electronic substrates are prepared by hot pressing ceramic green sheets containing ceramic powder and organic binders which leave no undesirable residue upon pyrolysis in the absence of oxygen. Boron nitride sheets made of boron nitride powder in a similar binder are placed on each side of the ceramic green sheet to form a composite. After hot pressing the composite so as to remove the binder and densify the ceramic, the BN layers are removed.

28 Claims, 2 Drawing Sheets

HOT PRESSING DENSE CERAMIC SHEETS FOR ELECTRONIC SUBSTRATES AND FOR MULTILAYER ELECTRONIC SUBSTRATES

BACKGROUND AND PRIOR ART:

I. Hot Pressing

The hot pressing process for consolidation of ceramic powders into dense polycrystalline materials involves simultaneous application of high temperature and uniaxial pressure. It is generally applied to achieve better properties than those achievable by pressureless sintering by obtaining very low porosity, finer grain size and better homogeneity. It is especially applicable to powders which are hard to sinter to high density by conventional means (high temperature only) because of inherent refractoriness of the compounds, poor powder characteristics (e.g., large agglomerates, low surface area) or a combination of the two. Such refractory compounds may include oxides (e.g., $Al_2O_3$, BeO), nitrides (e.g., AlN, $Si_3N_4$, BN), carbides (e.g., SiC, $B_4C$, WC), and borides (e.g., $TiB_2$) as well as multicomponent phases. Because the pressure is applied in one direction, the technique is usually limited to shapes of high symmetry (i.e., flat plates, short rods and cylinders, etc.).

FIG. 1 illustrates a simple hot pressing configuration. Graphite tooling (e.g., rams and dies) is commonly used because of the desirable physical properties possessed by graphite (i.e., high refractoriness, good machinability, good high temperature strength, low friction coefficient and low coefficient of thermal expansion) as well as its low cost and availability. Graphite tooling, however degrades in air at high temperatures and therefore requires protective non-oxidizing atmospheres (which are often also needed to prevent oxidation of non-oxide powders being processed by hot pressing).

A common problem associated with hot pressing thin pieces (e.g., less than 5 mm thick) is obtaining uniform die fill of the powder prior to processing. Non-uniform filling of the die can lead to thickness and property (e.g., density, strength) variations, as well as ram and/or die failure due to uneven stress distributions causing misalignment of the rams. Obtaining uniform die fill becomes exceedingly difficult as the area of the piece to be hot pressed increases and as attempts are made to simultaneously hot press several ceramic layers using graphite spacers between the powders (as is typically done to lower production costs). There are also problems associated with handling large quantities of powders during die filling. These include contamination from the die (particularly during the die filling step) as well as health hazards associated with airborne particulates. Another problem with hot pressing using graphite tooling is carbon contamination of the processed material. This can cause substantial discoloration of the material and can affect electrical and physical properties as well.

Powder handling problems mentioned above can be obviated to a great extent by the use of uniformly prepared, unfired sheets consisting of the powder to be hot pressed plus organic materials. These sheets, known as "green ceramic sheets", can be prepared to high uniformity by normal ceramic powder processing procedures such as extrusion or tape casting. The organic components are chosen to facilitate processing of the sheets and to impart sufficient strength to the ceramic body by binding the powder together such that it can be easily handled in its unfired form and loaded into the die. The use of green ceramic sheets is particularly beneficial if several ceramic layers are to be hot pressed simultaneously.

Besides imparting strength (and handleability) to the green ceramic sheet, a further requirement of a successful organic binder system is that it can be removed during heating such that no undesirable properties result from residues (e.g. carbon) that are left in the ceramic after densification. This attribute of a binder is commonly referred to as "clean-burning" even if the binder removal does not involve oxidation. Note that the property of clean-burning is dependent upon the environmental conditions during firing. For instance, if conventional sintering is performed in air, the binder removal is assisted by the presence of oxygen, which provides the potential for oxidation of carbonaceous residues from thermal decomposition. Clean-burning of the binder becomes more difficult to achieve when sintering under non-oxidizing or reducing conditions, where oxidation is effectively eliminated. Hot pressing with graphite tooling (in non-oxidizing atmospheres) exacerbates the binder removal problem, since the graphite will complete with the binder residues for any oxygen in the atmosphere. Hence, the benefits from adding small quantities of oxygen or water vapor to facilitate binder removal (as is sometimes done through the addition of water vapor) is minimized. The problem of binder removal is further exacerbated during hot pressing by the fact that the green body is enclosed by the tooling, thus requiring the binder volatiles to escape through the crack between the rams and the die. Hence, there are long diffusion paths through the green compact for the binder volatiles. There is also little chance for control of the local atmosphere in this encapsulated system. From consideration of the remarks above, it is concluded that hot pressing places more constraints on the successful binder system than conventional sintering, and thus eliminates from consideration some organics which are considered to be clean-burning when employed for conventional sintering processes.

Another common problem to be overcome in hot pressing of ceramics is sticking of the ceramic to the graphite tooling after densification. Boron nitride (BN) powder is often used as an effective release agent for hot pressing ceramics with graphite tooling. It is commonly applied to the graphite surfaces (which would contact with ceramic powder) by painting or spraying a BN-containing slurry (e.g. U.S. Pat. No. 4,518,736). BN powder is useful because it does not readily react with either graphite nor many refractory ceramics and does not readily densify itself. This, coupled with its plate-like particle morphology, allows easy delamination of the ceramic from the graphite after hot pressing.

If a thicker BN layer is necessary (because of slight reactions between the BN and other materials or because of the need for a better barrier to carbon diffusion into the ceramic), BN powder can be formed into a green sheet using the same procedures as described previously for making green ceramic sheets. The binder system used for making the BN green sheet must meet the same criteria of strength and clean-burning nature as mentioned above for the ceramic green sheets. In Japanese Published Patent Application 61-10074 a boron nitride mold releasing sheet material is used for SiC hot press sintering. The sheet material has a binder containing thermoplastic resins as its major component such as polyvinyl butyral (PVB) or polyvinyl alcohol (PVA) and a plasticizer such as butyl butylphthalylacrylate or polyethylene glycol and peptidizer such as glycerin or octadecylamine. In order for the sheet to maintain a required strength and flexibility the approximate range of the composition is given as 82-88 weight % of the mold-releasing material, 8-12 weight % of the binder, 4-6 weight % of the plasticizer, and less than 5 weight % of the peptidizing agent. For some applications, the PVB and PVA binders suggested by this Japanese patent may not be effective since they leave substantial residue upon pyrolysis in non-oxidizing atmospheres (see FIG. 2). Residues from these binders could migrate to the material to be hot pressed and affect its resultant properties.

II. Electronic Substrates

Ceramic materials are often used to support electronic components (e.g., silicon-based integrated circuits). These materials, referred to as substrates, are typically of a planar geometry and frequently have metallization on their surface(s) and/or within their interior. This metallization may serve as electrical signal pathways, ground planes, antennae, or as other passive or active electrical components in the structure. Also, the metallization may serve as a substrate for subsequent processing (e.g. brazing, plating) for adhering the ceramic material to other materials. The ceramic materials are typically of high specific density to provide optimal thermal and mechanical performance.

There are several terms used to describe substrates and how they are made. A single layer substrate refers to a substrate with metallization patterns only on its surface(s). A multilayer substrate, in the usual sense, has internal layers of metallization patterns and can also contain surface metallization. The metallized patterns on different layers of a multilayer substrate are often interconnected by metallized through holes, or vias, in the ceramic layers. A co-fired substrate refers to one in which the green ceramic powder and metal ink pattern are bonded and densified during a single firing step. Substrates with either single or multilayer metalization are sometimes referred to in the art as single or multi-layer packages, respectively.

A common approach to produce ceramic electronic substrates is by sintering ceramic (and metal) powders. This usually involves production of a sheet consisting of ceramic powder plus organic materials as described above. If an unmetallized substrate is to be produced from a green sheet, the sheet is simply heated under conditions to allow binder evolution and subsequent sintering of the ceramic powder. Unmetallized substrates are sometimes referred to as pre-fired substrates since electronic conductor patterns would be applied to the surface after the sintering of the ceramic (and usually by a separate firing step).

In a co-firing process, the metal conductor pattern is applied to the surface of the green sheet, usually as an ink or paste containing metal powder and organics, by, for example, screen printing. The metallized sheet can subsequently be fired to produce a single layer substrate with an electronic circuit pattern. In some cases, glass powder is added to the metal ink to promote mechanical bonding of the metallization to the ceramic substrate. However, this can be detrimental to the electrical conductivity of the metallization.

In a multilayer co-fired process, vias (i.e. electrical interconnections through the ceramic layers) can be formed by introducing a hole in the ceramic sheet and filling it with metal. Metallization patterns in the plane of each layer can be applied, for example, by screen printing metal inks. These metallized sheets of green tape can be laminated and fused together with sufficient pressure and minimal heat to cause the polymers in adjoining layers to bond together. The metallized laminated structure can be subsequently sintered in the manner of the single layer substrate to produce a dense multilayer substrate. A structure prepared in this manner is known as a "multilayer, co-fired" substrate.

The following discussion elaborates on some of the problems one can encounter when attempting to produce electronic substrates by sintering. One problem often encountered is uneven sintering due to inhomogeneities through the green sheet or due to uneven heating of the sheet. These problems can result in warping of the fired product, which can significantly affect yields. These problems become more pronounced as the substrate size increases.

As mentioned before, some compounds used as electronic substrates (e.g., AlN, $Si_3N_4$) are inherently difficult to sinter. This is because of the strong covalent bonds in these materials, which leads to poor atomic mobility. Obtaining ceramics of high density from green sheets of these compounds may be impossible via pressureless sintering unless very fine powders are available (which is often not the case).

Another problem which occurs in the co-firing of ceramics with metal patterns is being unable to control the lateral shrinkage during sintering of both the metal and ceramic powders (through control of powder morphology). This can result in substantial residual stresses at the ceramic-metal interface, which can lead to warpage of the substrate and spalling of the metals. Poor control of lateral shrinkage can also result in substrates which do not meet the dimensional tolerances required. This second point can be particularly worrisome when producing many substrates, all of which must meet specified tolerances to be useful. It is also of more concern as substrate sizes increase.

OBJECTS OF THE INVENTION

It is an object of this invention to provide an improved process for producing dense ceramic sheets suitable for electronic substrates by hot pressing.

It is a further object of this invention to provide an improved method for co-firing ceramic and metal powders to produce a ceramic substrate with an electrically conductive circuit pattern.

It is a further object of this invention to provide an improved method for producing a ceramic substrate with multiple layers of interconnected, electrically conductive circuit patterns.

It is a further object of this invention to provide a process for densification of hard-to-sinter powders into material suitable for electronic substrates.

It is a further object of this invention to provide an economical method for producing electronic substrates by simultaneous hot pressing of several substrates.

It is a further object of this invention to provide a binder system which leaves no undesirable residues upon pyrolysis in the absence of oxygen such that electronic substrates can be produced by hot pressing.

SUMMARY OF THE INVENTION

The present invention is directed at producing unmetallized, single-layer metallized, and multi-layer ceramic substrates for electronic applications by hot pressing. This technique allows for the consolidation of hard to sinter powders (including composite mixtures) into dense ceramics. It also provides for increased yields by effectively eliminating warpage. Elimination of warpage, in turn, increases the size of substrate that can be easily manufactured. Furthermore, lateral shrinkage of electronic circuit patterns during processing is effectively eliminated since consolidation is principally normal to the plane of the substrate. This will provide both increased dimensional control and improved yields. The above advantages are made possible by the use of a binder system which leaves no undesirable residues upon pyrolysis in the absence of oxygen.

Dense ceramic sheets suitable for electronic substrates are prepared by first making at least one ceramic green sheet containing ceramic powder and organic binders which leave no undesirable residue upon pyrolysis in the absence of oxygen. Boron nitride sheets made of boron nitride (BN) powder and an organic binder which leave no undesirable residue upon pyrolysis in the absence of oxygen are then placed on each side of the ceramic green sheet to form a composite. The composite is hot pressed under conditions which facilitate binder removal and densify the ceramic. Finally the BN layers on each side of the dense ceramic sheet are removed.

Multiple dense ceramic sheets can be made simultaneously by placing boron nitride (BN) sheets adjacent to the ceramic green sheets to produce a stack of the form BN-ceramic-[BN-ceramic]$_x$-BN where x is a positive integer prior to hot pressing. A preferred way to make the ceramic green sheet is to mix ceramic powder, polyethylene and oil and to compound the mixture at an elevated temperature to facilitate melting of the polyethylene. The compounded mixture is molded to form sheets by extrusion through a die and the oil is removed by extraction with an organic solvent. Alternatively the ceramic green sheets can be formed by pressing the compounded mixture into flat sheets prior to the extraction step.

Dense ceramic electronic substrates having one or more dense conductive metal circuit patterns on the surface can be made by this procedure where after the ceramic green sheets are made the desired metal circuit patterns are deposited such as by screen printing on the ceramic sheets with a suitable metal which is compatible with the ceramic. Then after the hot pressing with the adjacent boron nitride green sheets the resulting product will have the desired circuit pattern.

Again multiple metallized dense ceramic layers can be made simultaneously by stacking boron nitride sheets adjacent to the metallized ceramic sheets. A preferred metal for metallizing is tungsten (W). The boron nitride sheets can be laminated on each side of the ceramic green sheet for ease of operation.

A further feature of the invention is that multilayer ceramic electronic substrates can be produced with internal interconnections between the metal circuits at the various layers. The ceramic green sheets are prepared as described above and metal-filled vias are made in one or more ceramic sheets by punching holes in the ceramic sheets and filling with metal powders. Then the desired metal circuit patterns are deposited followed by laminating together the desired number of ceramic sheets in a manner which maintains registration of the metallized patterns and vias on the various layers to form a green multilayer ceramic-metal composite. Boron nitride sheets are placed on each side of the composite and the composite is made by hot pressing using the procedure described above.

The metal powders can be placed in the vias by forming metal powder containing sheets made with metal powders and organic binders which leave no undesirable residue upon pyrolysis in the absence of oxygen. A hole can be punched in a ceramic green sheet, followed by placing this metal powder containing sheet against the ceramic green sheet and forcing the metal containing material into the hole in the ceramic green sheet by a punching action. If surface cavities are desired in the substrates, then a hole can be punched in the ceramic sheet which will reside on the surface of the composite and the hole can be filled with BN tape material of similar thickness prior to the lamination of the layers.

DESCRIPTION OF PREFERRED EMBODIMENTS

In one embodiment, an unmetallized (or bare) substrate is made. The initial step involves producing a handleable sheet consisting of ceramic powder and an organic binder which gives strength and toughness to the unfired ceramic sheet. The ceramic powder should be the compound desired for the polycrystalline substrate or a precursor which converts to the desired compound upon heating. Examples of ceramic compounds having suitable dielectric and thermal properties for electronic substrate applications include, but are by no means limited to, $Al_2O_3$, BeO, and AlN.

Figure 1:
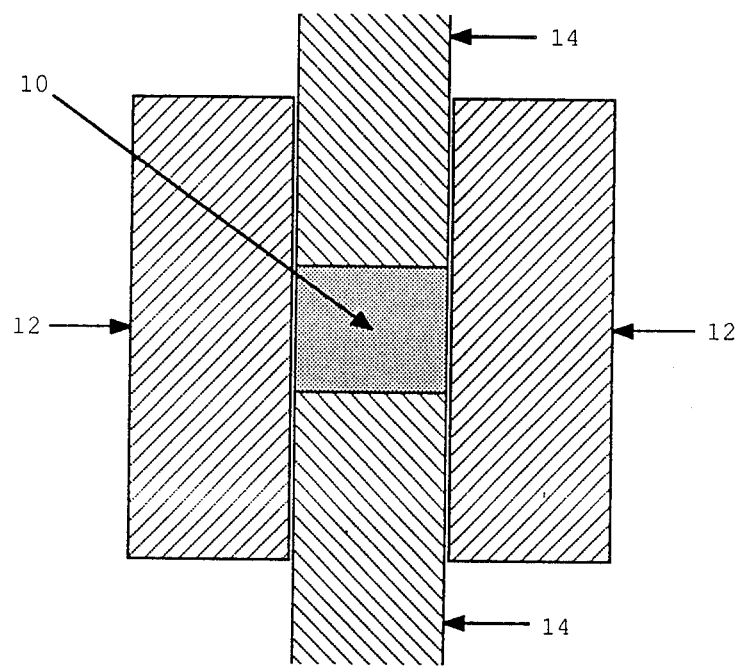
FIG. 1 is a cross-sectional view of a simple hot pressing configuration.

A simple hot pressing configuration is shown in FIG. 1. A ceramic powder 10 is placed between graphite dies 12 on each side and graphite rams 14 on top and bottom.

The organic binder should leave no undesirable residue upon pyrolysis prior to the densification of the ceramic powder. This requirement is dictated by the fact that such residues (i.e., carbon) can have harmful effects on both the physical and electronic properties of the ceramic. For example, U.S. Pat. No. 4,642,148 shows data indicating a substantial drop in the dielectric breakdown voltage in a ceramic circuit board when residual carbon levels were greater than 100 ppm. Since it is desirable to carry out the hot pressing in a non-oxidizing atmosphere (either to prevent oxidation of a non-oxide ceramic powder or the graphite tooling), it may be necessary that the binder pyrolysis be carried out in the absence of oxygen. This places a more stringent condition on the binder system since oxidation is effectively eliminated as a means of removing residues of pyrolysis. A binder candidate meeting this criteria is high-density polyethylene. For example, U.S. Pat. No. 3,755,204 describes a method for making porous ceramic supports where a step involves molding ceramic preforms using high-density polyethylene as the binder and oil as the plasticizer. The mixture can be compounded at an elevated temperature to facilitate melting of the polymer binder and then the compounded mixture can be formed into sheets by processes such as extrusion through a die or by pressing the compounded mixture into flat sheets. In either case, it is preferable to have the compound mixture at an elevated temperature to improve the flow properties of the mixture. The oil can be removed from this system after formation of the sheets and before hot pressing by extraction with a suitable solvent such as trichloroethane. The extraction step reduces the total amount of organics to be removed during hot pressing and eliminates all but the very clean-burning polyethylene.

Figure 2:
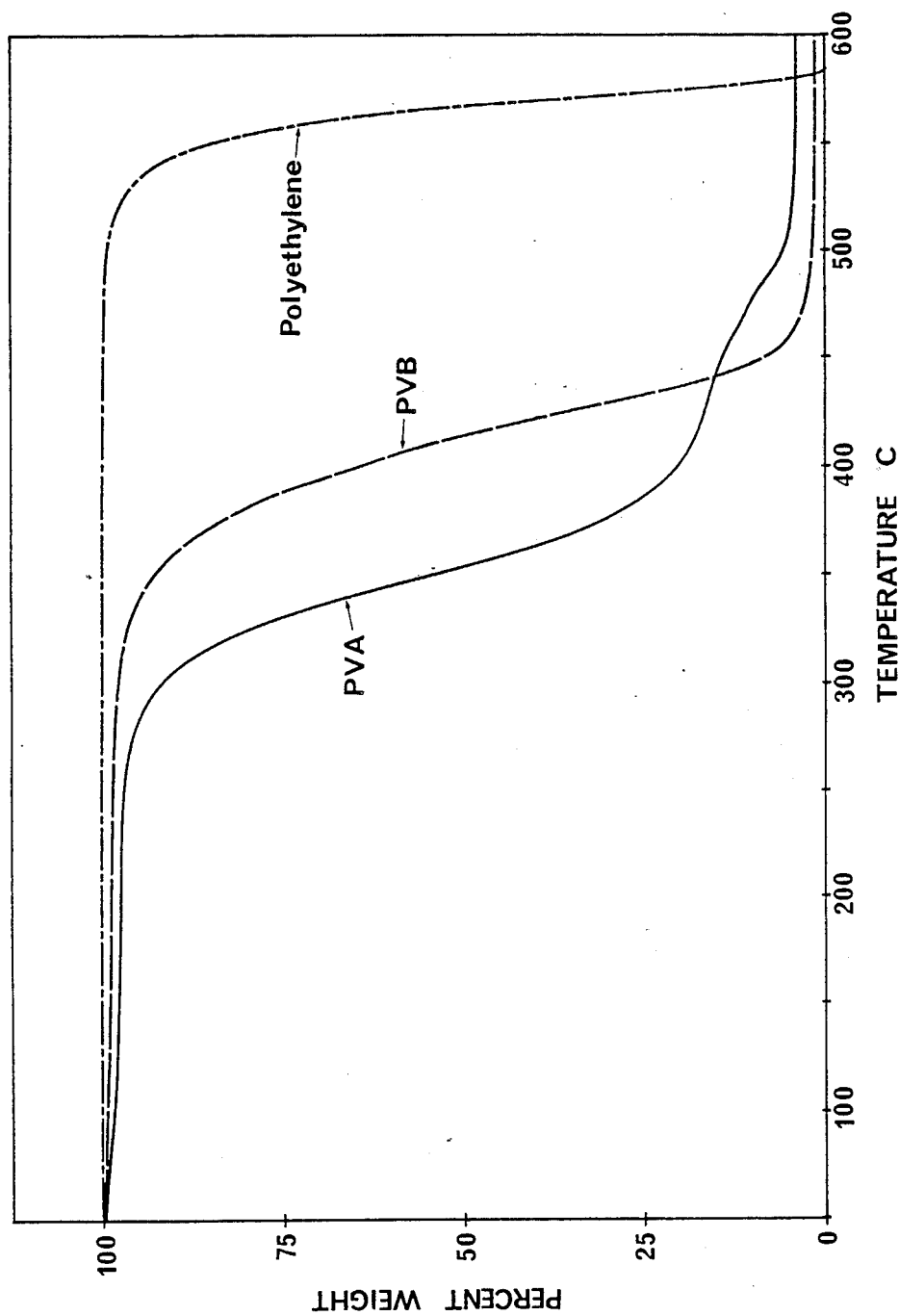
FIG. 2 is a thermogravimetric analysis of organic binders during heating in the absence of oxygen.

FIG. 2 shows data from thermogravimetric analysis of organic binders in argon/3% hydrogen layers are removed. Multiple sheets can be made simultaneously by this technique and multilayer ceramic electronic substrates can be produced with internal interconnections between the metal circuits at the various layers by depositing metal circuit patterns on the green sheets such as by screen printing depicting the clean-burning nature of polyethylene in the absence of oxygen. Data for two commonly used organic binders, polyvinyl alcohol (PVA) and polyvinyl butyral (PVB). Above 600° C. there was no measurable residue for polyethylene, whereas the PVA and PVB left 4.0 and 1.4 weight percent, respectively. It is also noted from FIG. 2 that polyethylene evolves over a narrow temperature range as compared to the other two binders. This is indicative of rapid gaseous evolution, which is not desirable for sintering since it would tend to disrupt the green microstructure and, hence lower the fired density. However, for hot pressing, rapid evolution of the binders can be tolerated since the green body is constrained by the tooling and pressure can be applied to maintain or recover intimate contact between the particles. In fact, rapid evolution may be desired since it allows for faster processing cycles.

To reduce interactions between the graphite tooling and the ceramic being processed, a layer of material with reduced reactivity can be introduced at the graphite/ceramic interface. Such a material is boron nitride.

BN sheet is produced using BN powder and an organic binder which also leaves no undesirable residue upon pyrolysis. BN remains inert (i.e., does not sinter or interact with the substrate material) under conditions necessary to hot press most ceramic powders. Hence, it is used to isolate the ceramic material from the graphite and to delaminate sheets of substrate material from the hot press tooling after processing, or in the case of simultaneous processing of ceramic sheets, to serve as a delaminant layer between sheets of substrate material. The BN also provides a non-reactive barrier to prevent contamination of the substrate material by the tooling (e.g., carbon). In this respect, it provides an improvement over the conventional technique of using thin graphite sheet as a delaminant layer. It has also been found that the use of BN tape results in a smoother surface on the fired ceramic sheet as compared with graphite foil. This minimizes or eliminates the need for surface machining of the ceramic sheet after the hot pressing step.

Polyethylene represents a successful binder for the BN sheet because its clean-burning nature eliminates the potential problem of reaction between carboneous residues and the ceramic at the ceramic-BN interface. In this respect, use of polyethylene as the binder in BN tape represents an improvement over the art described by Japanese Pat. No. 61-10074 to Sadakata where PVA and PVB are recommended binders. As discussed above, PVA and PVB leave significant residues upon pyrolysis in the absence of oxygen. The BN sheet can be fabricated using polyethylene and oil as described previously for the ceramic sheet to be hot pressed.

To produce a single sheet of ceramic substrate, the BN sheet can be laminated to both sides of the ceramic green sheet and hot pressing is carried out under conditions necessary to first remove the binder and finally to densify the ceramic. It is not necessary to laminate the BN sheet to the ceramic green sheet. The BN sheets could just be placed on either side of the ceramic green sheet. The advantage of laminating is that it prevents further contamination of the ceramic green sheet as it is being handled. Simultaneous hot pressing of several layers to reduce manufacturing costs can be carried out by placing rigid spacers of the tooling material between the laminant structures described above such that several unit cells of the form (BN-ceramic sheet-BN-rigid spacer) are stacked upon one another in the hot press. Alternatively, unit cells of the form (BN sheet-ceramic sheet-(BN sheet-ceramic sheet)$_x$-rigid spacer) (where x is a positive integer) can be built up to further improve the economics of the process. In this build up procedure, either a BN sheet is laminated to just one side of a ceramic sheet or else the stack is made by just alternatively adding a BN sheet and a ceramic sheet.

After hot pressing, the substrate sheets can be easily separated from the graphite tooling and/or each other. The BN on the surface of the dense ceramic sheets can be subsequently removed by washing and/or grit-blasting.

In another embodiment, a ceramic electronic substrate is produced having a dense conductive metal circuit pattern on its surface. As in the previous embodiment, handleable sheets of ceramic powder and BN with clean-pyrolyzing binders are produced. Onto the ceramic sheet, a metallized pattern is applied by any technique available (e.g., screen printing metal powder containing inks, imaging patterns from metal powder loaded photopolymers). Since the shrinkage is unidirectional normal to the plane of the substrate (parallel to the axis of compression), the technique for creating the circuit pattern is not limited to those utilizing unconsolidated powders. For example, thin metal wires could serve as conductor lines in this embodiment.

It is understood to those skilled in the art that selection of appropriate conductor-ceramic systems depends not only on the ultimate properties of the individual constituents, but also on their compatibility during processing. Compatible systems have constituents which neither chemically degrade nor interact under conditions necessary to consolidate the substrate into a dense body. Examples of such systems include, but are by no means limited to, $Al_2O_3$-W, $Al_2O_3$-Mo and AlN-W.

After applying the metal pattern, BN sheets are laminated to the metallized ceramic and hot pressed under conditions appropriate for binder removal and densification of both the ceramic and metal. The BN is essential for cases where graphite tooling is used, since direct contact between graphite and most refractory metals would result in carbide formation during heating, which would affect the electrical performance of the conductive pattern.

It should be noted that use of clean-burning binders such as polyethylene in the ceramic and BN sheets is crucial to the success of this technique, since carboneous residues will react with the refractory metallization at high processing temperatures to produce undesirable metal carbides.

As with the previous embodiment, simultaneous processing of several metallized sheets is possible by building up stacks as described for the unmetallized sheets.

As mentioned above, this process offers the potential for increased yields since lateral shrinkage of the metallization and warpage of the substrate are effectively eliminated. This process also eliminates the need for additives to the refractory metal ink which are often used to promote bonding to the ceramic (e.g. glass frit). This can result in higher electrical conductivity of the metallization since less impurities would be present at the grain boundaries and better thermal conductance through the metal-ceramic interface due to the better contact between the metal and ceramic which is brought about by this process.

In another embodiment, a multi-layer ceramic substrate with internal interconnected metal circuits at various layers is produced. As in the previous embodiments, the initial step is to produce ceramic and BN sheets each containing a binder which pyrolyzes with no undesirable residue under the conditions necessary to process the multi-layer substrate. Metal-filled vias are produced in the ceramic sheets by creating holes in the ceramic sheets and filling with metal powders. A common technique for via filling is successive screen printing of metal-filled ink into the holes while pulling a partial vacuum on the underside of the ceramic sheet, thus sucking the ink down into the hole. However, this may require several printings per layer and it is questionable whether sufficient loading of the via is reproducibly attained by this method. An alternative and preferred technique is to prepare a metal powder-loaded green sheet using the same techniques (and binders) as those used to produce the ceramic sheet and simply punch a plug of metal-filled sheet into a previously punched hole in the ceramic sheet. This can be accomplished by placing a metal-loaded green sheet directly above the ceramic green sheet after punching a hole and, using the same size punch, forcing material from the metal green tape into the ceramic green tape using a second punching action. This method allows uniform loading of metal in the vias. It also assures that the binder burnout characteristics of the vias and ceramic tape are the same.

After the via filling is accomplished, the desired metal circuit patterns can be applied to each layer as required using techniques described previously for the single-layer substrate. The layers of metallized green tape are subsequently laminated together in a manner which maintains registration of the metallized patterns between the various layers. As with the previous embodiment, BN sheet is laminated to each side of the multi-layer structure and the entire package is hot pressed under conditions required for binder removal and densification of the multi-layer substrate. Finally, the BN is removed to give a dense ceramic substrate with internal conductive patterns. Multiple substrates can again be produced in one hot-pressing operation using techniques described previously.

This technique for producing multi-layer substrates has all of the advantages listed previously for the single layer substrates. In addition, it eliminates concern for potential delamination of the layers prior to or during sintering (as can happen with conventional sintering of multi-layer ceramic substrates), since the uni-directional pressure assures intimate contact and bonding of the layers during hot pressing.

Non-planar geometries can also be achieved using this process. For example, it is possible to produce exposed surface cavities using the hot pressing process. This is accomplished by judicious use of BN sheet within the surface layer(s) of the green ceramic sheets to be consolidated. For instance, if a surface cavity is required, a hole of the required dimensions can be punched in the ceramic sheet and filled with a BN plug of the same dimensions. The process can be identical to the previously described via-filling approach, except that BN sheet is substituted for the metal sheet. This BN-filled ceramic sheet would be an outer layer on a multi-layer preform to be hot pressed. After the hot pressing step, the BN within the cavity can be removed by grit blasting or washing as before.

This invention is further explained by way of examples.

EXAMPLE 1

This example illustrates the utility of the hot pressing technology to make a dense sheet of a hard-to-sinter compound (AlN) that is desirable for electronic substrate applications.

A formulation of high purity AlN powder with $CaCO_3$ additions, polyethylene and oil was prepared by blending the components in the weight percentages listed in Table 1 into a moldable compound at approximately 160° C. All other elemental impurities were less than 0.02%. Similarly, a BN formulation was compounded at approximately 160° C. in weight percentages listed in Table 1. The formulations were pressed at approximately 160° C. into flat sheets and cut to dimensions (3"×3") that would fit the graphite die to be used in hot pressing the preforms. The sheet thicknesses were approximately 0.040" for AlN and 0.030" for BN. The sheets were placed in a trichloroethane bath to extract the oil, pressed flat, and laminated at approximately 110° C. and less than 500 psi pressure to produce a preform stack of the form BN-AlN-BN. This stack was loaded into the graphite die and graphite rams were placed in contact with the BN layers. Key elements of the hot pressing cycle were: (1) a temperature hold at 600° C. under vacuum and no ram pressure to facilitate binder evolution, and (2) a maximum temperature of 1900° C. and 1,000 psi ram pressure in nitrogen to densify the AlN. After hot pressing, the stack was removed from the die and the BN was easily removed from the AlN surfaces by grit blasting.

The resultant AlN sheet was highly translucent, which signifies high purity, high density, little interaction with the graphite tooling and the clean-burning nature of the polyethylene binder. Surface roughness and warpage were measured to be 49 micro inches and 0.04%, respectively. Thermal conductivity was measured on a thicker specimen, made by the same process, and was determined to be 1.8 W/cm° K. The above properties show that good quality aluminum nitride substrates can be produced by this technique with surface finish that requires little or no machining.

TABLE 1

| Composition of Preforms for Example 1 | | |
|---|---|---|
| | Preform Composition | |
| Description | (weight %) | Component |
| AlN formulation | 68.0 | AlN Powder (Tokuyama Soda Grade F) |
| | 3.4 | $CaCO_3$ Powder |
| | 3.4 | Polyethylene |
| | 25.2 | Mineral Oil |
| BN formulation | 61.0 | BN Powder |
| | 6.0 | Polyethylene |
| | 33.0 | Mineral Oil |

EXAMPLE 2

This example illustrates the ability to co-fire adherent conductive metallization on AlN using the hot pressing technology.

A sheet of AlN with polyethylene binder was prepared for hot pressing according to Example 1 using the formulation listed in Table 2. BN sheets were also prepared according to Example 1. After the extraction step and prior to lamination, W metal patterns were applied to the AlN sheet by screen printing W ink. The ink was prepared by mixing the ingredients listed in Table 3 until a smooth, uniform consistency was attained. The metallized AlN sheet was laminated to BN sheet as in Example 1 and hot pressed according to Example 1 except that the maximum temperature was 1700° C. The dense AlN sheet was cleaned by grit-blasting to reveal a dense AlN sheet with conductive W metallization on its surface. The metal pattern showed no sign of lateral distortion and was quite adherent (as evidenced by the fact that it remained intact during the grit-blasting step). The sheet resistivity of W metallization was measured to be 11 milliohms/square.

TABLE 2

Composition of Preforms for Example 2

| Description | Composition (weight %) | Component |
|---|---|---|
| AlN formulation | 81.0 | AlN Powder (H. C. Starck Grade A) |
|  | 4.0 | $CaCO_3$ Powder |
|  | 3.0 | Polyethylene |
|  | 12.0 | Mineral Oil |

TABLE 3

Composition of W Ink for Example 2

| Description | Composition (weight %) | Component |
|---|---|---|
| W Ink Formulation | 70.8 | W Powder - 1.7 μm average particle size |
|  | 23.6 | W Powder - 0.5 μm average particle size |
|  | 0.3 | Ethyl Cellulose |
|  | 4.2 | α-Terpineol |
|  | 1.0 | Dispersant (Troykyd 98-C) |

EXAMPLE 3

This example illustrates the ability to produce an AlN substrate with buried, electrically conductive W metallization using the hot pressing approach. The buried pattern is electrically connected to the surface by W-filled through-holes (vias) which were produced using the novel via filling technology.

AlN and BN sheets were prepared according to Example 1 with thicknesses of approximately 0.050" for the AlN sheet and 0.030" for the BN sheet. A 0.050" of W was produced by blending W powder (96.5%), polyethylene (0.7%) and oil (2.8%) at approximately 160° C. Oil extraction from the W sheet was done by soaking the sheet in hexane. Extraction from the AlN and BN sheet was performed in trichloroethane.

AlN substrates with buried W circuit patterns that protruded to the substrate surface by use of W vias perpendicular to the substrate surface were produced in the following manner. First, 0.025" diameter holes were punched through the AlN sheets using a cylindrical rod of the same diameter. These holes were filled with the W sheet material by placing the W sheet over the AlN sheet and forcing the W material into the holes by the same punching action. This procedure was carried out to produce an array of W-filled holes in two green AlN sheets. A circuit pattern was then screen printed on the surface of these AlN sheets using W ink such that the ends of the screen printed W lines aligned with the W vias. After screen printing, a second AlN sheet was laminated to each metallized sheet such that the screen printed patterns were sandwiched between AlN layers with W vias protruding from one side. BN sheets were subsequently laminated to the two AlN preforms to produce a stack of the form BN-AlN-BN-AlN-BN. This stack was hot pressed according to conditions described in Example 1. Upon removal from the die, the substrates were easily separated and cleaned by grit-blasting.

The resultant substrates were highly translucent AlN which easily showed the location of the buried W patterns. This metallization had low electrical resistivity (approximately 10 milliohms/square), which was measured across the protruding W vias.

EXAMPLE 4

This example illustrates the ability to produce an $Al_2O_3$ substrate with buried, electrically conductive W metallization using the hot pressing approach. It also demonstrates the via technology and the ability to produce surface cavities in the hot pressed substrate such that the buried metallization can be exposed within the cavity.

$Al_2O_3$ sheets were prepared by blending the components listed in Table 4 into a moldable compound and pressing into flat sheets at approximately 160° C.

TABLE 4

Composition of Preforms for Example 4

| Description | Composition (weight %) | Component |
|---|---|---|
| $Al_2O_3$ formulation | 81.6 | $Al_2O_3$ Powder |
|  | 2.9 | $SiO_2$ Powder |
|  | 0.5 | MgO Powder |
|  | 3.0 | Polyethylene |
|  | 12.0 | Mineral Oil |

BN sheets were prepared according to Example 1 and a W sheet was prepared according to Example 3. The thicknesses of the $Al_2O_3$, W and BN sheets were approximately 0.050 inch. An array of W-filled holes was made in an $Al_2O_3$ sheet using the procedure described in Example 3. A circuit pattern was then screen printed of these $Al_2O_3$ sheets using W ink (prepared according to Example 2) suchs that the ends of the screen printed W lines aligned with the W vias. To a second $Al_2O_3$ sheet, a square hole was punched (approximately ½ inch on a side) and filled with BN sheet material using the same punching technique as that used to produce the W-filled holes. This BN-filed $Al_2O_3$ sheet was laminated to the metallized $Al_2O_3$ sheet such that the screen printed W pattern was sandwiched between the two $Al_2O_3$ layers. This stack was hot pressed to a temperature of 1600° C. with a ram pressure of approximately 1,000 psi in an argon atmosphere. Upon removal from the die, the BN was removed from the $Al_2O_3$ surface by grit-blasting.

The resultant $Al_2O_3$ substrate was translucent and showed no noticeable lateral distortion of the surface cavity. The metallization was adherent within the cavity and had a sheet resistivity of approximately 11 milliohms/square.

It is understood that the foregoing detailed description is given merely by way of illustration and that many variations may be made therein without departing from the spirit of this invention.

What is claimed is:

1. A process for producing dense ceramic electronic substrates comprising the following steps:
    (a) preparing at least one ceramic green sheet comprising ceramic powder and organic binders which leave no undesirable residue upon pyrolysis in the absence of oxygen;
    (b) placing boron nitride sheets comprising boron nitride (BN) powder and organic binders which leave no undesirable carbonaceous residue upon pyrolysis in the absence of oxygen, on each side of the ceramic green sheet prepared in step (a) to form a composite;
    (c) hot pressing the composite prepared in step (b) under sufficient temperature and pressure to densify the ceramic; and
    (d) removing the BN layers on each side of the dense ceramic sheet.

2. A process according to claim 1, wherein the BN layer is removed by washing or grit blasting.

3. A process according to claim 1, wherein the boron nitride sheets in step (b) are laminated on each side of the ceramic green sheet.

4. A process for making multiple dense ceramic sheets simultaneously according to claim 1, wherein the boron nitride (BN) sheets are placed adjacent to the ceramic green sheets to produce a stack of the form BN-ceramic-[BN-ceramic]$_x$-BN where x is a positive integer prior to step (c).

5. A process according to claim 1, where the ceramic green sheet in step (a) is made by:
    (i) mixing ceramic powder, polyethylene and oil; and compounding the mixture at an elevated temperature to facilitate melting of the polyethylene;
    (ii) molding the compounded mixture in step (i) to form sheets by extrusion through a die; and
    (iii) removing the oil by extraction with an organic solvent.

6. A process according to claim 6, where the ceramic green sheets are formed in step (ii) by pressing the compounded mixture in step (i) into flat sheets.

7. A process according to claim 1, where the boron nitride sheet of step (b) is made by:
    (i) mixing boron nitride powder, polyethylene, and oil; and compounding the mixture at an elevated temperature to facilitate melting of the polyethylene;
    (ii) molding the compounded mixture in step (i) to form sheets by extrusion through a die; and
    (iii) removing the oil by extraction with an organic solvent.

8. A process according to claim 1, where the ceramic powder is primarily AlN.

9. A process according to claim 1, where the ceramic powder is Al$_2$O$_3$.

10. A process for producing dense ceramic electronic substrates having dense conductive metal circuit pattern(s) on the surface(s) comprised of the following steps:
    (a) preparing ceramic green sheets comprising ceramic powder and organic binders which leave no undesirable residue upon pyrolysis in the absence of oxygen;
    (b) depositing the desired metal circuit pattern(s) to the ceramic sheets with a suitable metal which is compatible with the ceramic;
    (c) placing boron nitride green sheets on each side of the ceramic sheet having metal circuit pattern(s) in step (b);
    (d) hot pressing the metallized sheets under sufficient temperature and pressure to densify both the ceramic and the metal powders; and
    (e) removing the BN layers from the sides of the dense ceramic sheet.

11. A process according to claim 10, wherein the desired metal circuit pattern is applied by screen printing a metal paste.

12. A process for making multiple metallized dense ceramic layers simultaneously according to claim 10, where prior to step (d) the boron nitride sheets are placed adjacent to the metallized ceramic sheets to produce a stack of the form BN-metallized ceramic-[BN-metallized ceramic-]$_x$-BN where x is a positive integer.

13. A process according to claim 10, where the ceramic powder is primarily AlN and the metal is W.

14. A process according to claim 10, where the ceramic powder is Al$_2$O$_3$ and the metal is W.

15. A process according to claim 10, wherein the ceramic green sheet in step (a) is made by:
    (i) mixing ceramic powder, polyethylene and oil; and compounding the mixture at an elevated temperature to facilitate melting of the polyethylene;
    (ii) molding the compounded mixture in step (i) to form sheets by extrusion through a die; and
    (iii) removing the oil by extraction with an organic solvent.

16. A process according to claim 10, wherein the boron nitride sheets in step (c) are laminated on each side of the ceramic green sheet.

17. Dense ceramic electronic substrates having dense conductive metal circuit pattern(s) on the surface(s) made by the process of claim 10 wherein the lateral shrinkage of the metallization and warpage of the substrate are effectively eliminated.

18. A process for producing multi-layer ceramic electronic substrates with internal interconnected metal circuits at the various layers comprising the following steps:
    (a) preparing ceramic green sheets comprising ceramic powder and organic binders which leave no undesirable residue upon pyrolysis in the absence of oxygen;
    (b) producing metal-filled vias in the ceramic sheet(s) of step (a) by punching holes in the ceramic sheets and filling with metal powders;
    (c) depositing the desired metal circuit patterns to the ceramic sheets of step (b);
    (d) laminating the desired number of ceramicسheets of step (c) together in a manner which maintains registration of the metallized patterns and vias on the various layers to form a green multi-layer ceramic-metal composite;
    (e) placing boron nitride sheets on each side of the composite of step (d);
    (f) hot pressing the BN-composite-BN product of step (e) under sufficient temperature and pressure to densify both the ceramic and the metal powders; and (g) removing the BN layers on each side of the dense ceramic sheet.

19. A process according to claim 18, wherein the desired metal circuit pattern is applied by screen printing a metal paste.

20. A process according to claim 18, wherein the BN layer is removed by washing or grit blasting.

21. A process according to claim 18, wherein the boron nitride sheets in step (e) are laminated on each side of the ceramic green sheet.

22. A process according to claim 18, wherein the ceramic green sheet in step (a) is made by:
   (i) mixing ceramic powder, polyethylene and oil; and compounding the mixture at an elevated temperature to facilitate melting of the polyethylene;
   (ii) molding the compounded mixture in step (i) to form sheets by extrusion through a die; and
   (iii) removing the oil by extraction with an organic solvent.

23. A process for producing a multiple of multi-layer ceramic substrates simultaneously according to claim 18, where prior to step (f) the boron nitride sheets are placed adjacent to the multi-layer ceramic-metal composites of step (d) to produce a stack of the form BN-composite-[BN-composite]$_x$-BN where x is a positive integer.

24. A process according to claim 18, where the ceramic powder is AlN and the metal is W.

25. A process according to claim 18, where the ceramic powder is $Al_2O_3$ and the metal is W.

26. A process for producing multi-layer ceramic electronic substrates according to claim 18, where step (b) is replaced by the following:
   (i) preparing a metal powder containing sheet comprising metal powders and organic binders which leave no undesirable residue upon pyrolysis in the absence of oxygen; and
   (ii) punching a hole(s) in the ceramic green sheets of step (a), followed by placing the metal powder containing sheet of step (i) against the ceramic green sheets and forcing the metal containing material into the hole(s) in the ceramic green sheets by a punching action.

27. A process for producing multi-layer ceramic electronic substrates according to claim 18, where surface cavities are produced in the substrates by:
   (i) punching hole(s) in the ceramic sheets of step (a) which will reside on the surface of the composite of step (d); and
   (ii) filling the holes in step (i) with BN tape material of similar thickness prior to the lamination of the layers in step (d).

28. Multi-layer ceramic electronic substrates with internal interconnected metal circuits at the various layers made by the process of claim 18 wherein the lateral shrinkage of the metallization and warpage of the substrate are effectively elminated.

* * * * *